(12) United States Patent
Torres

(10) Patent No.: US 8,370,101 B2
(45) Date of Patent: Feb. 5, 2013

(54) CIRCUIT CARD ASSEMBLY TESTING SYSTEM FOR A MISSILE AND LAUNCHER TEST SET

(75) Inventor: Michael Anthony Torres, Newbury Park, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 866 days.

(21) Appl. No.: 12/127,129

(22) Filed: May 27, 2008

(65) Prior Publication Data
US 2009/0299677 A1 Dec. 3, 2009

(51) Int. Cl.
*G01R 31/28* (2006.01)
(52) U.S. Cl. ......... 702/118; 702/117; 702/121; 702/185
(58) Field of Classification Search .................. 702/118, 702/119, 121, 123
See application file for complete search history.

(56) References Cited

U.S. PATENT DOCUMENTS

| | | | | |
|---|---|---|---|---|
| 4,922,191 A | * | 5/1990 | Conover | 324/750.19 |
| 2001/0024119 A1 | * | 9/2001 | Stockford | 324/158.1 |
| 2002/0027737 A1 | * | 3/2002 | Haitani | 360/75 |
| 2002/0055822 A1 | * | 5/2002 | Amadeo et al. | 702/38 |
| 2003/0212902 A1 | * | 11/2003 | van der Made | 713/200 |
| 2004/0212973 A1 | * | 10/2004 | Ice | 361/796 |
| 2005/0034028 A1 | * | 2/2005 | Son | 714/43 |
| 2005/0209808 A1 | * | 9/2005 | Kelbon et al. | 702/117 |
| 2009/0222250 A1 | * | 9/2009 | Ito | 703/14 |

\* cited by examiner

*Primary Examiner* — Michael Nghiem
*Assistant Examiner* — Paul D Lee
(74) *Attorney, Agent, or Firm* — Robert R. Lerma; Christopher L. Blackburn

(57) ABSTRACT

The invention generally relates to a circuit card assembly testing system for testing and troubleshooting new and failed circuit card assemblies. Specifically, circuit card assemblies that are part of a guided missile and launcher test set are tested using a board testing system (BTS), the preferred embodiment, to isolate faults or to verify final assembly. The BTS is used for testing and troubleshooting a wide variety of circuit card assemblies at the end of final assembly and upon their return as a failed item from the field. The BTS is designed to rapidly isolate faults in failed circuit card assemblies that have been returned to a maintenance facility by providing an improved means of fault isolation. The BTS is designed to aid in the production of circuit card assemblies by providing an improved means of rapidly verifying the proper operation of circuit boards after final assembly.

15 Claims, 8 Drawing Sheets

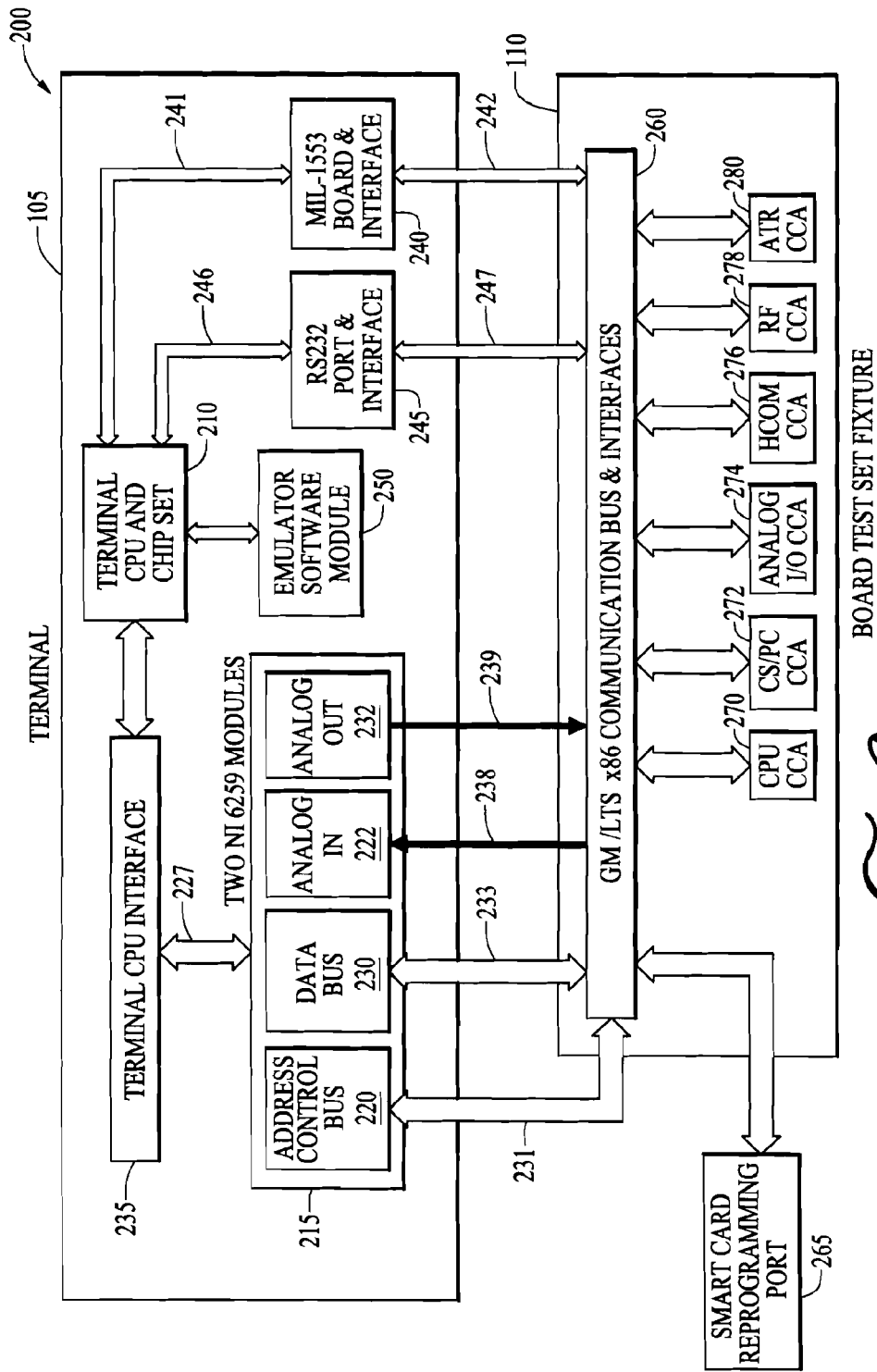

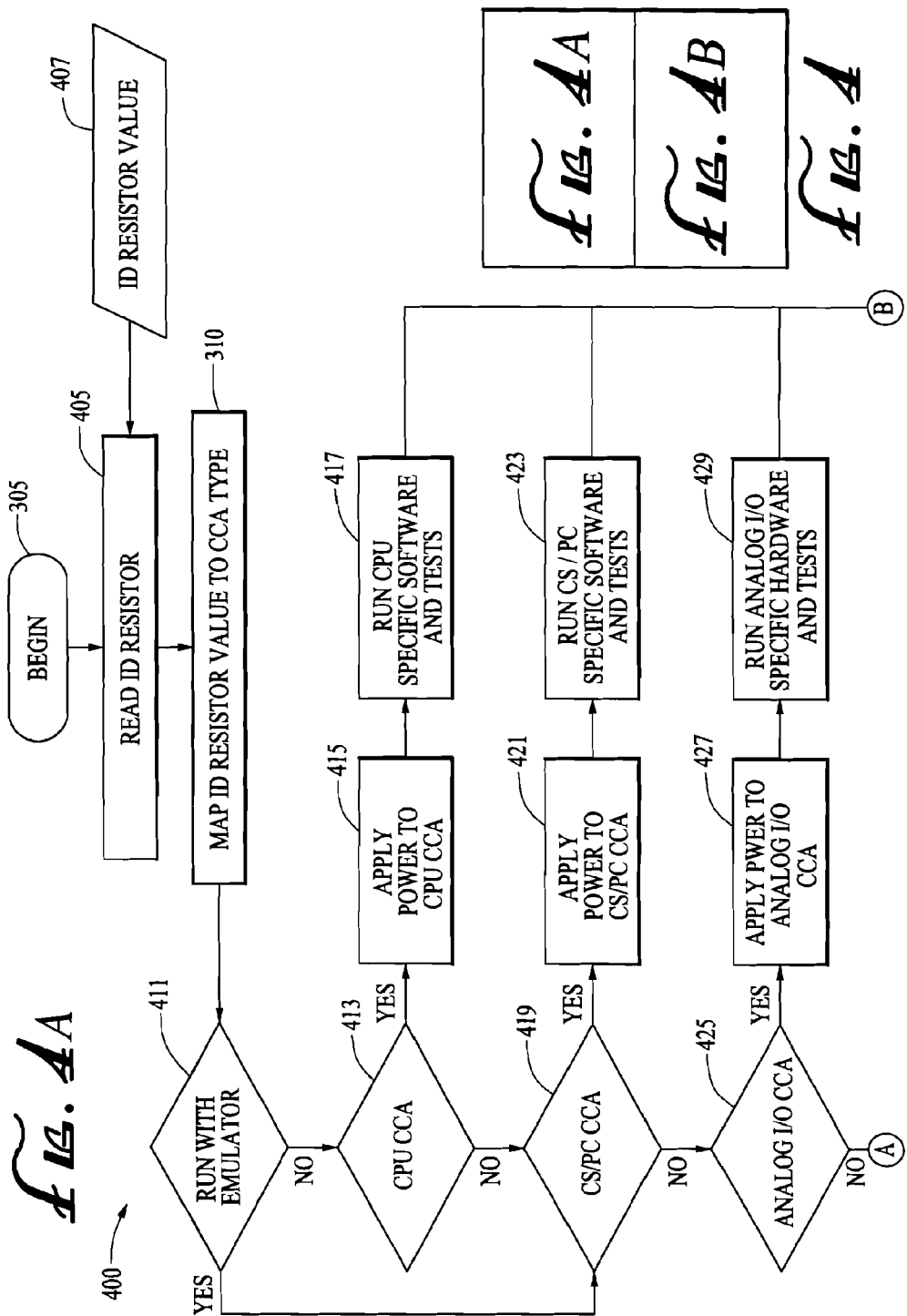

CIRCUIT CARD ASSEMBLY TESTING SYSTEM FOR A MISSILE AND LAUNCHER TEST SET

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefore.

BACKGROUND OF THE INVENTION

1. Field of the Invention

The invention generally relates to a circuit card assembly testing system for testing and troubleshooting new and failed circuit card assemblies. Specifically, circuit card assemblies that are part of a Guided Missile and Launcher Test Set (GML/TS) are tested using a board testing system (BTS), the preferred embodiment, to isolate faults or to verify final assembly. The BTS is used for testing and troubleshooting a wide variety of circuit card assemblies at the end of final assembly, and upon their return as a failed item from the field. The BTS is designed to rapidly isolate faults in the failed circuit card assemblies that have been returned to a maintenance facility by providing an improved means of fault isolation through the use of an operational test. The BTS is designed to aid in the production of circuit card assemblies by providing an improved means of rapidly verifying the proper operation of circuit boards after final assembly by performing an operational test.

2. Description of the Prior Art

Historically, High Speed Anti-Radiation Missiles (HARM) and a Guided Missile Launcher and Test Set (GM/LTS), are designed to maintain them, are complex systems. The United States Air Force (USAF) has developed and fielded a HARM, a HARM launcher and a compatible GML/TS for use as an All Up Round (AUR) missile tester. The fielded GM/LTS was developed with the intention that the circuit board assemblies internal to the fielded GM/LTS would not be repaired. The fielded GM/LTS is equipped with an internal module self-test that identifies failed circuit card assemblies (CCAs) that cause the fielded GM/LTS to malfunction. The maintenance concept for the CCAs internal to the fielded GM/LTS is to identify and replace the failed CCA with a new CCA and then to dispose of the failed CCA. However, over time this maintenance concept has proven to be too expensive to be continued.

The USAF has decided to send the GM/LTS CCAs identified as faulted to the HARM depot for repair. Since the depot has no other means for testing the faulted GM/LTS CCAs, the depot uses a fully functioning fielded GM/LTS to perform fault isolation on the returned CCAs. Although the fielded GM/LTS is useful for identifying faulted CCAs, it is ill suited for use as a component level CCA test bed. The fielded GM/LTS accepts the faulted CCAs on a mounted closed back-plane rack that does not provide access for probing the CCA signals and is not suitable for selectively controlling the operation of the software loaded into the memory of CCA. To overcome these deficiencies and to facilitate monitoring signals during testing, wires must be manually attached to key test points in order to provide access to low level test equipment. Also, since the software operation of the CCA cannot be controlled, testing must be synchronized using an internal trigger in order to capture the failing signal events when they occur. This makes capturing and diagnosing failing signals difficult and time consuming. Also, it is often necessary to produce special versions of test software to diagnose certain problems. On average, the depot requires three months to diagnose and repair a single faulted GM/LTS CCA. Some of the CCAs require up to six months for repair.

The preferred embodiment of the board testing system (BTS) adds a new capability that reduces the time to isolate the faults present in a failed CCA, improves the accuracy in identifying faults, and provides a uniform process of repairing the faulted GM/LTS CCAs. These new capabilities that are present in the preferred embodiment allow a tester access to previously hard to access signals and also eliminates the necessity of writing and compiling tailored versions of test software.

The preferred embodiment that is the BTS is currently the only system in existence that is capable of testing and diagnosing the faulted GM/LTS CCAs. The BTS executes all internal self-tests that are preformed on the CCAs with the added feature that the BTS replicates the fielded GM/LTS and produces the exact same fail codes along with the added capability of statically pausing software execution at any point. The BTS is designed to facilitate the user's ability to diagnose problems by allowing the user to directly probe the CCAs when in a failed state. The BTS is an innovative design that combines commercial off the shelf modules with custom signal conditioning that results in a system that is both robust in test capability and is cost effective to support and maintain.

SUMMARY OF THE INVENTION

The preferred embodiment of the present invention is directed to an apparatus and a method that combines commercial off the shelf modules with custom signal conditioning resulting in a system to test and troubleshoot failed circuit card assemblies (CCAs) that are part of a fielded Guided Missile Launcher and Test Set (GM/LTS).

There are two primary components included in the board test set (BTS). The first is the terminal computer that hosts the main processor that controls overall test flow and provides the serial and parallel interfaces for connecting the terminal computer to the second primary component, the BTS fixture.

The BTS is designed such that the BTS fixture has the same mechanical and electrical mounting as found in the fielded GM/LTS back-plane. Each of the fielded GM/LTS CCAs are mountable onto the BTS fixture. Once a CCA is mounted onto the BTS fixture it is tested independently or is tested in concert with the Central Processing Unit Circuit Card Assembly (CPU CCA). The backplane design that is integral to the BTS fixture provides a user with real time access points to the CPU CCA or to other CCAs using external test probes.

Each CCA, except the Smart Card CCA and the RF Source CCA, have a unique identification resistor integrated into the CCA. The BTS verifies the presence of the identification resistor when the CCA is plugged into the BTS fixture and before the circuit card can be powered and tested. As an additional safeguard, each CCA has a unique keyed slot preventing a user from plugging a CCA into the wrong BTS fixture card slot. Only the CCA with the proper keying can be seated into a particular slot on the BTS fixture. Once the CCA is seated into the proper slot in the BTS fixture then a set of tests unique to the CCA functionality are run.

The process of inserting the CCA in the correct slot, identifying the inserted CCA, running the unique tests particular to the inserted CCA, collecting the results of the unique tests, and assessing the functional status of the CCA are repeated for each CCA that requires either final assembly verification or troubleshooting.

BRIEF DESCRIPTION OF THE DRAWINGS

The features described above, other features, aspects, and advantages of the preferred embodiment will become better understood with regard to the following description, appended claims, and accompanying drawings where:

FIG. 1b is another rotated three dimensional representation of the preferred embodiment showing the sides not visible in FIG. 1a.

FIG. 2 is a functional block diagram of the BTS showing the relationship of the components included as part of the BTS.

FIG. 4 is further broken into FIG. 4a and FIG. 4b for the sake of clarity.

DETAILED DESCRIPTION OF THE PREFERRED EMBODIMENT

Figure 1:
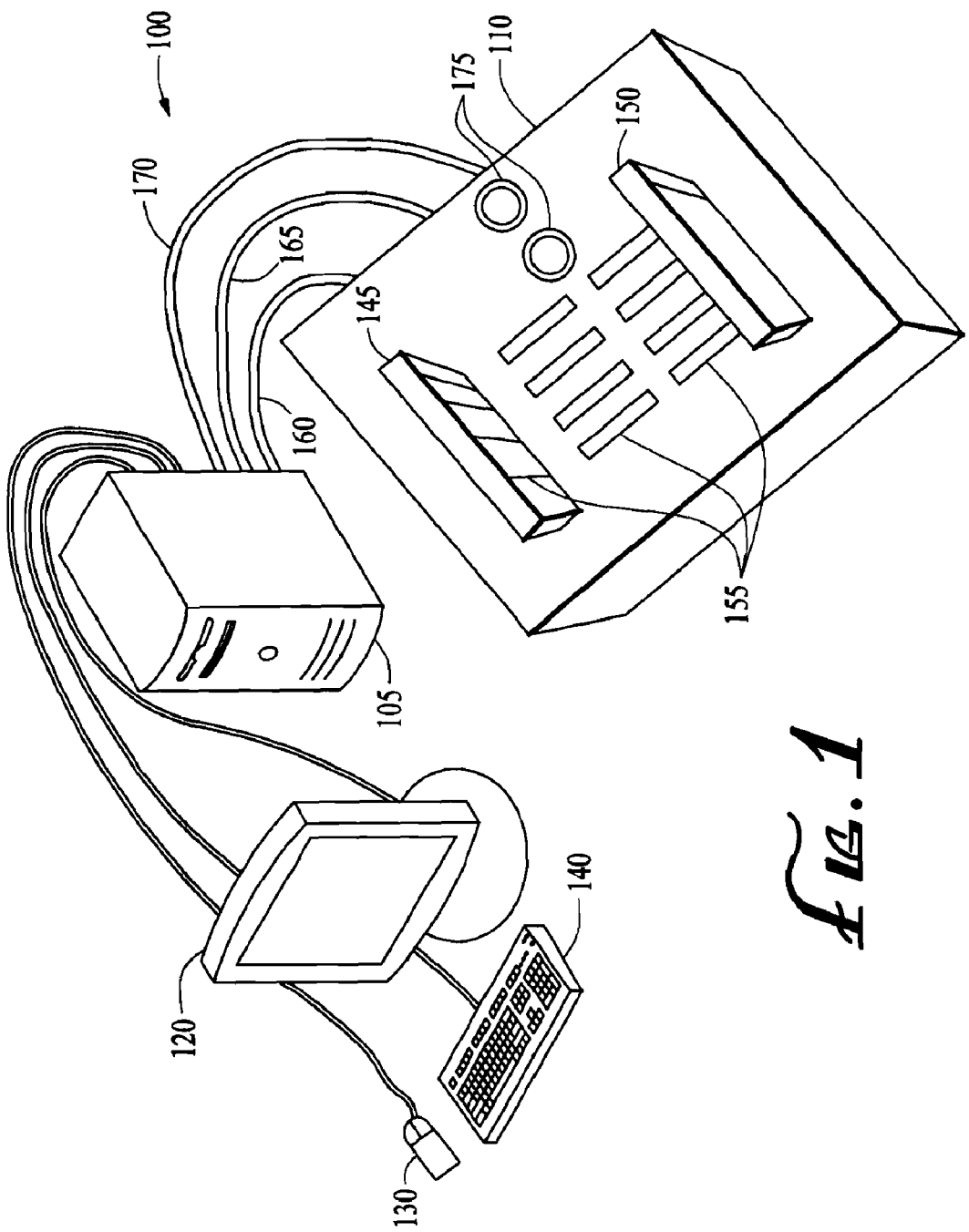
FIG. 1 is a depiction of the Board Test Set (BTS), particularly its major components.

Referring to FIG. 1, shown are the primary components included in the Board Test Set (BTS) 100. Generally, the first primary component is the terminal computer 105 that provides a user interface, hosts the main computer processing unit that controls the test flow, and provides the hardware interfaces for connecting the terminal computer 105 to the second primary component, the BTS fixture 110. As part of the user interface the terminal computer 105 is also connected to a computer monitor 120, a computer mouse 130, and a computer keyboard 140. The terminal computer 105 uses commercial off the shelf (COTS) modules and integrates software development packages unique to the specialized circuit boards mounted within the terminal computer 105. The terminal computer 105 controls test software execution by allowing the user to pause the software execution at any point in the test flow.

The terminal computer 105 is a personal computer (PC) based system containing a number of specialized circuit boards, specialized software, and specialized interfaces. The terminal computer 105 houses at least two National Instrument Data Acquisition (DAQ) modules having model number NI 6259 and a communications bus card conforming to Military Standard number 1553 (Mil-Std-1553). Mil-Std-1553 defines an asynchronous communications interface using a bus controller and a plurality of remote terminals communicating via a command response message protocol. The terminal computer 105 also includes an RS-232 serial interface. The data acquisition modules, the communications bus, and the hardware interfaces are under the control of the central processor that is integral to the terminal computer 105. The terminal computer 105 is connected to the BTS fixture 110 by a cable set (160, 165 and 170).

The BTS 100 is designed such that the BTS fixture 110 has the same mechanical and electrical mounting configuration as found in the fielded Guided Missile Launcher Test Set (GM/LTS). The fielded GM/LTS Circuit Card Assemblies (CCAs) slated for testing are mounted onto the BTS fixture 110 between two keyed guide panels (145 and 150). Once a suspect or newly built CCA is properly mounted in the correct CCA slot 155 the CCA is available for testing either independently or is tested in concert with a Central Processing Unit Circuit Card Assembly (CPU CCA) 270. The GM/LTS x86 communications bus and interface 260 backplane design that is integral to the BTS fixture 110 provides a user with real time access to test points on the CPU CCA (FIG. 2, 270) or to other CCAs (FIG. 2, 272, 274, 276, 278, or 280) when using external test probes. In the preferred embodiment the BTS fixture 110 contains an x86 communications bus and interface (FIG. 2, 260) based on the Intel 80286 processor backplane bus that is identical in functionality to the backplane bus that is found in the fielded GM/LTS ground support equipment.

The generic term x86 refers to the instruction set of the most commercially successful CPU architecture in the history of personal computing. The x86 instruction set is used in processors manufactured by Intel, Advanced Micro Devices, VIA Technologies, and others, and is derived from the first few generations of processors that are backward compatible with Intel's original 16-bit 8086 CPU, most of which end in the number 86. Since then, many additions and extensions have been added to the x86 instruction set. The additions and extensions are backward compatible with the real mode operation of the x86.

Figure 1A:
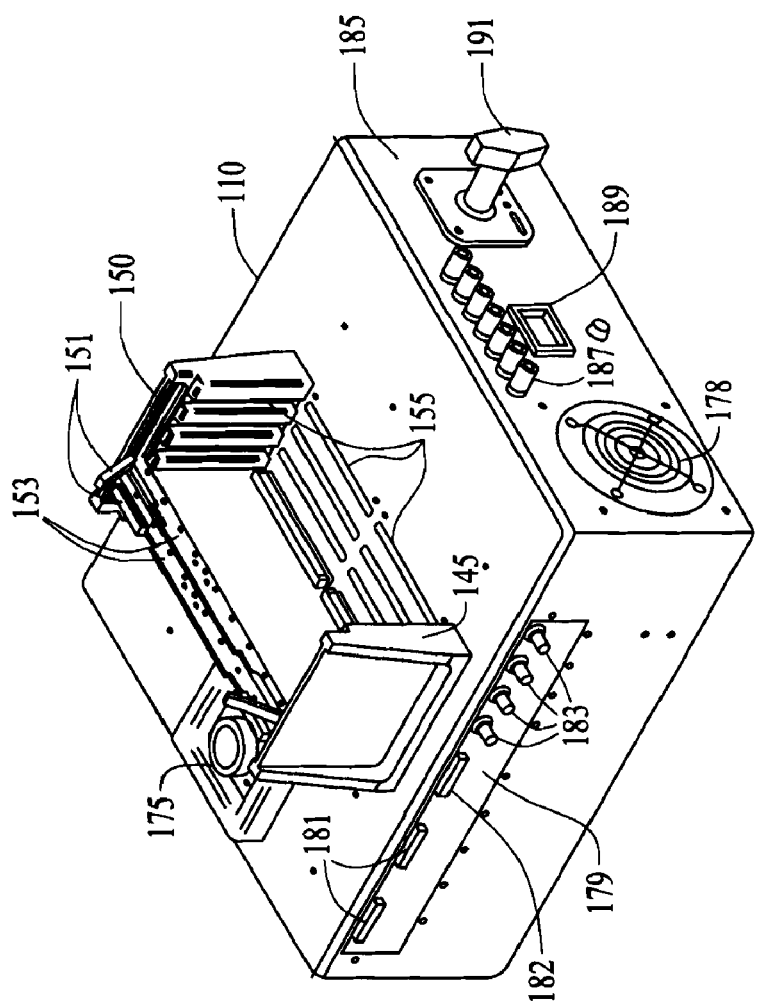
FIG. 1a is a rotated three dimensional representation of the preferred embodiment.
Figure 1B:
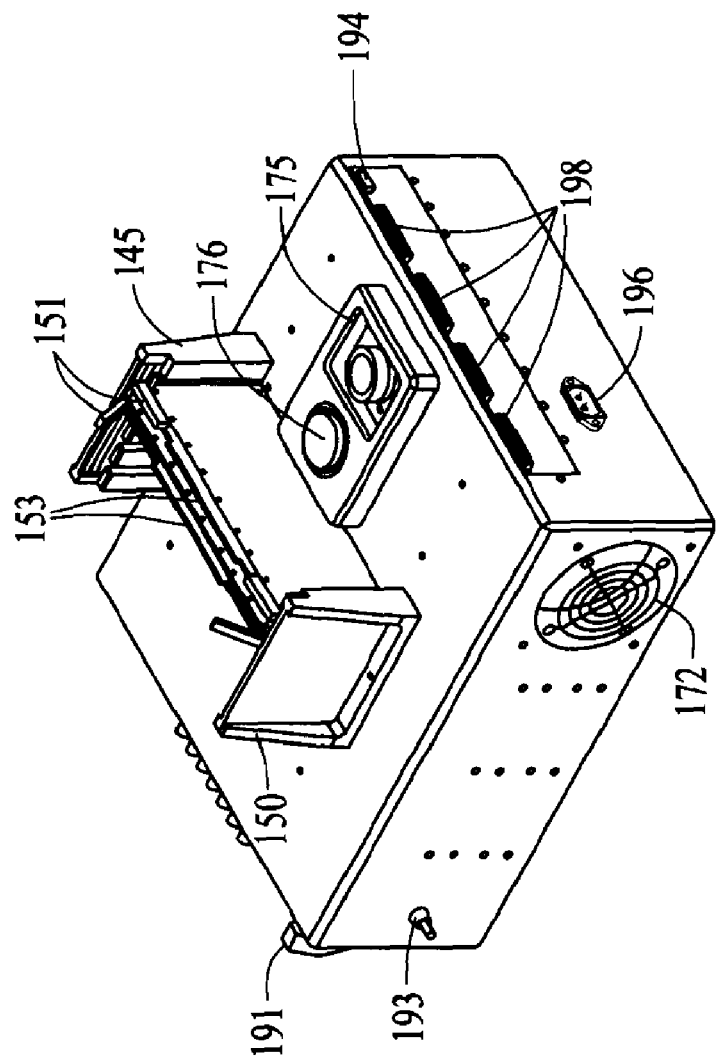
Figure 1C:
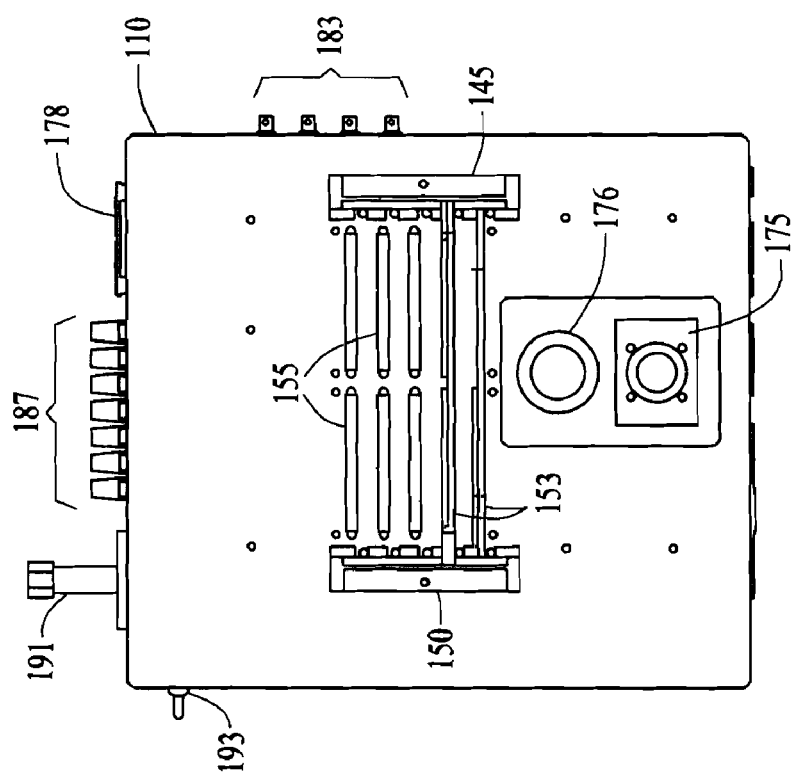
FIG. 1c is a top view of the preferred embodiment.

Referring to FIGS. 1a, 1b and 1c, FIG. 1a shows a rotated three dimensional representation of the preferred embodiment, FIG. 1b shows another rotated three dimensional representation of the preferred embodiment, and FIG. 1c top view of the preferred embodiment. The preferred embodiment that is the BTS fixture 110 and its significant features are now described. A card cage comprised of a left sidewall 145, a right sidewall 150, both of which are aligned with a plurality of card connectors 155 mounted to the BTS fixture 110. The purpose of the left sidewall 145 and a right sidewall 150 is to provide a mounting structure for and to guide a circuit card assembly 153 into its correct position when affixed to the BTS fixture 110. An additional feature of the plurality of card connectors 155 is that each circuit card assembly 153 is keyed in order to prevent a circuit card assembly 153 from being installed into an incorrect card cage slot (145, 150, and 155). The keying is accomplished with the use of guide pin holes built into each card connector 155 for preventing the improper insertion of a designated circuit card 153, and leads to a locking capability with the use of lock down tabs 151 that are part of each designated circuit card assembly. Each card slot is configured to accept a single card type. Mounted on the top of the BTS fixture 110 are two Smart Card cable connectors (175, 176). A plurality of fans (172 and 178) are mounted to the sidewalls of the BTS fixture 110 in order to prevent the internal components of the BTS fixture 110 from overheating.

Generally, a connector panel 179 is configured with a plurality of electrical connectors (181, 182) are mounted thereon to accept a wide variety of electrical signals to support BTS 110 self test functions. Another set of electrical connectors 183 are compatible with MIL-STD-1553 data bus. Mounted on a front panel 185 are a plurality of probing jacks 187, a meter 189 to display current measurements during testing evolutions, and a switch 191 to control which current measurement appears on the meter 189. Also mounted externally on the BTS fixture 110 is a toggle switch 193 to apply input power accepted by receptacle 196 that feeds the electronic circuitry internal to the BTS fixture 110. In the preferred embodiment one set of electrical connectors 198 are compatible with the NI 6259 circuit boards (FIG. 2, 215). A 9 pin Dsub connector 194 is used to connect an RS-232 interface.

Referring to FIG. 2 200, shown is a functional block diagram describing the internal portions of the hardware and software features of the BTS 100. The terminal computer 105 portion of the BTS 100 contains an internal terminal central processing unit (CPU) and compatible chip set 210 that performs the activities of a host computer. The CPU and compatible chip set 210 is defined as having a core processor, random access memory, read only memory, control circuitry, executable operational system software, application specific software and other components as necessary to perform host computer operational functions. In the preferred embodiment, the internal terminal CPU and compatible chip set 210 is connected to and in communication with two NI 6259 data acquisition modules 215, Each NI 6259 module 215 provides electronic circuitry and software to operate an address control and bus module 220, a data bus module 230, an analog input module 222, and an analog output module 232. Generally, each NI 6259 module (220, 222, 230 and 232) is in communication with an internal terminal CPU interface 235 via a separate data bus 227. The two NI 6259 modules 215 are connected and programmed to work in combination, resulting in functioning as a single card.

In the preferred embodiment each of the NI6259 modules 215 provide forty eight digital input and output lines. The digital input output lines that are partitioned as thirty-two buffered lines and sixteen control and measurement lines. The thirty-two buffered digital lines allow for synchronized digital outputs or inputs. The sixteen control and measurement lines route, as well as measure, complex periodic waveforms. The digital inputs and outputs operates at a maximum rate of ten megahertz (MHz).

The analog input module 222 and the analog output module 232 together provide sixty-four analog inputs, and eight analog outputs. The analog input module 222 communicates on a dedicated input interface 238. The analog output module 232 communicates on a dedicated input interface 239. The analog inputs and outputs provide at least sixteen bits of accuracy. The analog inputs and outputs as well as the digital inputs and outputs are synchronized using two onboard thirty-two bit counters. The analog inputs operate up to 1.25 mega samples per second (MS/s) and the analog outputs operate up to 2.8 MS/s. The data module 230 is 16 bits wide. Both eight-bit byte and sixteen bit word transfers are supported. Also both memory and input and output space data transfers are supported.

National Instruments provides a suite of software drivers for developing test software to control the operation of the NI6259 modules 215. The suite of software drivers, are adapted for programming in the C/C++ object oriented computer programming languages compatible with Microsoft Visual Studio application.

In addition to the above described circuits and interfaces is an RS232 compliant port and interface 245 and a MIL-STD-1553 compliant circuit board 240. The RS232 compliant port and interface 245 provides a serial interface (246, 247) between the terminal CPU and compatible chip set 210 and the x86 communications bus interface 260. The MIL-STD-1553 compliant circuit board 240 provides an asynchronous digital interface(241, 242) between the terminal CPU and compatible chip set 210 and the x86 communications bus interface 260.

For the preferred embodiment, the BTS test fixture 110 includes an x86 communications bus interface 260 that is configured as a backplane to accept a plurality of differing fielded CCAs (270, 272, 274, 276, 278, or 280). Each of the fielded CCAs (270, 272, 274, 276, 278, or 280) and the smart card 265 are mutually exclusive in operation as items under test. The BTS 200 can only test one type of CCA at a time.

Generally, an emulator software module 250 is invoked by the terminal CPU and compatible chip set 210 in the event that a fielded CPU CCA 270, hereafter referred to as CPU CCA 270, is not inserted into the appropriate card cage slot (145, 150, and 155). The emulator software module 250 in conjunction with the x86 communications bus interface 260 performs as a functional replacement for the CPU CCA 270, but more importantly, provides the operator of the BTS 100 a means to halt the execution of a specific test run for the purpose of examining the detailed operation of the Smart Card CCA 265 or the CCA under test (270, 272, 274, 276, 278, or 280). When a CPU CCA 270 is properly loaded into the BTS test fixture 110 the CPU CCA 270 may be tested using specific CPU CCA test software (FIG. 4, item 417). In the preferred embodiment, the CPU CCA 270 and a software emulator 250 having the same functionality as the CPU CCA 270, both are compatible with the x86 communications bus interface 260.

Specifically, the x86 instruction set is used to program and drive an x86 based architecture suite using the x86 communications bus interface 260 in order to emulate the operation of the CPU CCA 270. The emulation performed by the CPU that is accomplished using a plurality of buffered digital lines included with the NI 6259 modules 215. Although the address bus 222 and the control bus 227 are generally unidirectional, these buses as well as the data buses (232 and 233) are bidirectional. When the NI 6259 modules 215 operate in the emulation mode they are under the indirect control of the terminal CPU and chip set 210, they drive the address control bus 231 and the data bus 233, and they control all data transfers on the analog input interface 238 and all of the data transfers on the analog output interface 239. The NI 6259 modules 215 are also capable of halting the execution of the processor on the CPU CCA 270 or the Smart Card CCA 265. When the CPU CCA 270 or the Smart Card CCA 265 processors are halted, the system resources on the halted CCA are directly accessible by the NI 6259 modules 215.

Figure 3:
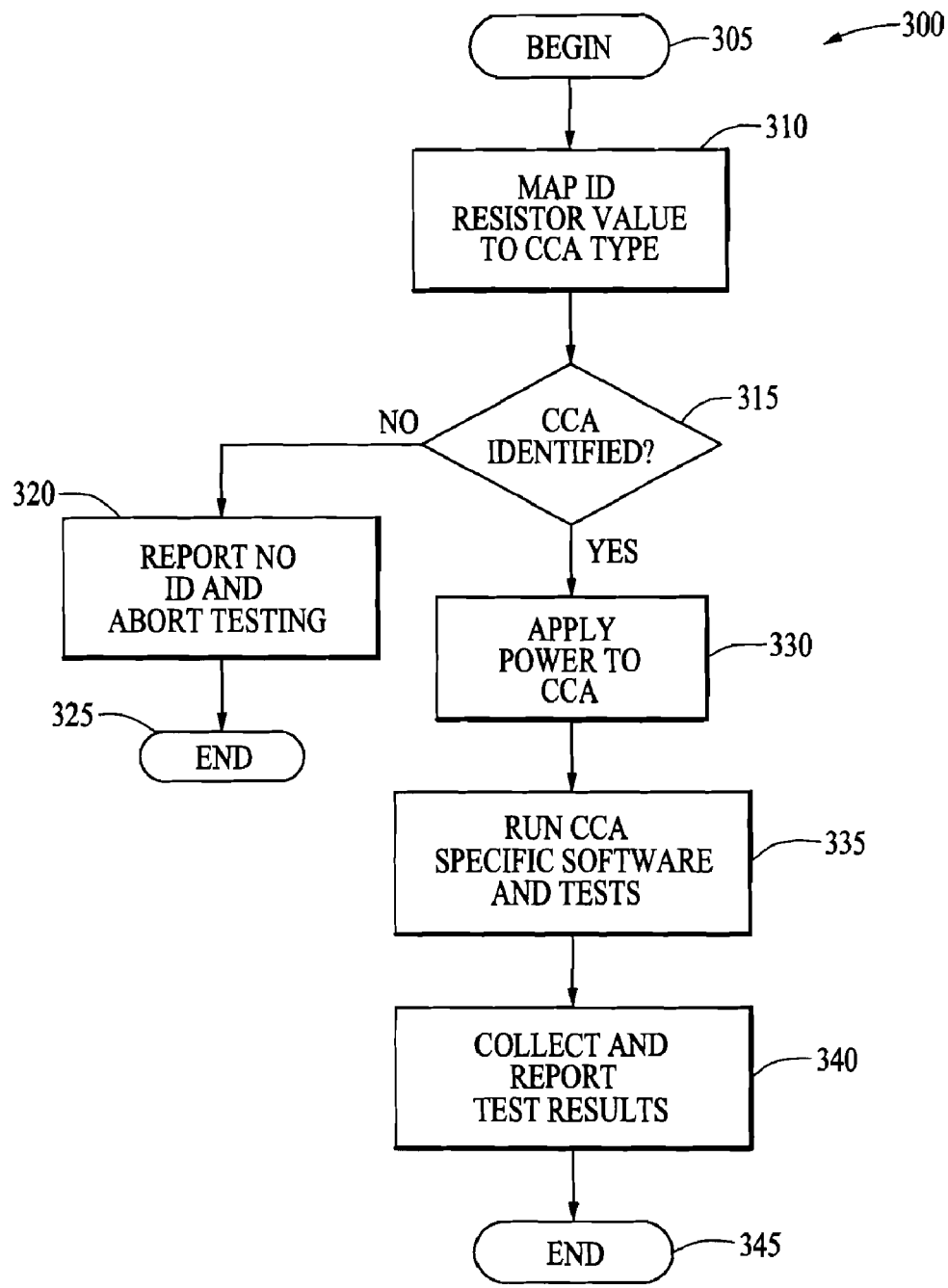
FIG. 3 is a high level flowchart describing the major steps performed by the hardware and software included as part of the BTS.

Referring to FIG. 3, flowchart 300, shown is a high level block diagram of the preferred embodiment describing the major steps performed by the BTS (FIG. 1, item 100). The steps to perform fault isolation for a CCA identified as failed or to perform production testing on a newly built CCA begin (step 305) by first mapping the value of an identification resistor to a type of CCA (step 310). Each CCA (FIG. 2, 270, 272, 274, 276, or 280), with the exception of the smart card CCA and the RF CCA (FIG. 2, items 265 and 278 respectively), are configured with an identification resistor having a resistance value that is particular to the type of CCA (FIG. 2, 270, 272, 274, 276, or 280). If the resistance measured on the CCA (FIG. 2, 270, 272, 274, 276, or 280) corresponds to a CCA card type (step 315) then the BTS fixture (FIG. 1, item 110) applies an input power waveform to the CCA (FIG. 2, 270, 272, 274, 276, or 280) in step 330. At this point the software to run tests specific to the powered CCA are executed (step 335). At the completion of the specific CCA tests (step 335) the test results are collected and reported (step 340). At this point, a user may evaluate the test results contained in the report and assess the functional status of the CCA under test. This ends the test cycle (step 345) and another CCA (FIG. 2, 270, 272, 274, 276, or 280) may be loaded for testing or a subsequent test cycle may be commanded. If the CCA identification check (step 315) fails to identify the CCA (FIG. 2, 270, 272, 274, 276, or 280) and the presence of a smart card CCA or an RF CCA (FIG. 2, items 265 or 278 respectively) is negative then a report of no card identification (step 320) is made and the test cycle ends (step 325).

Figure 4B:
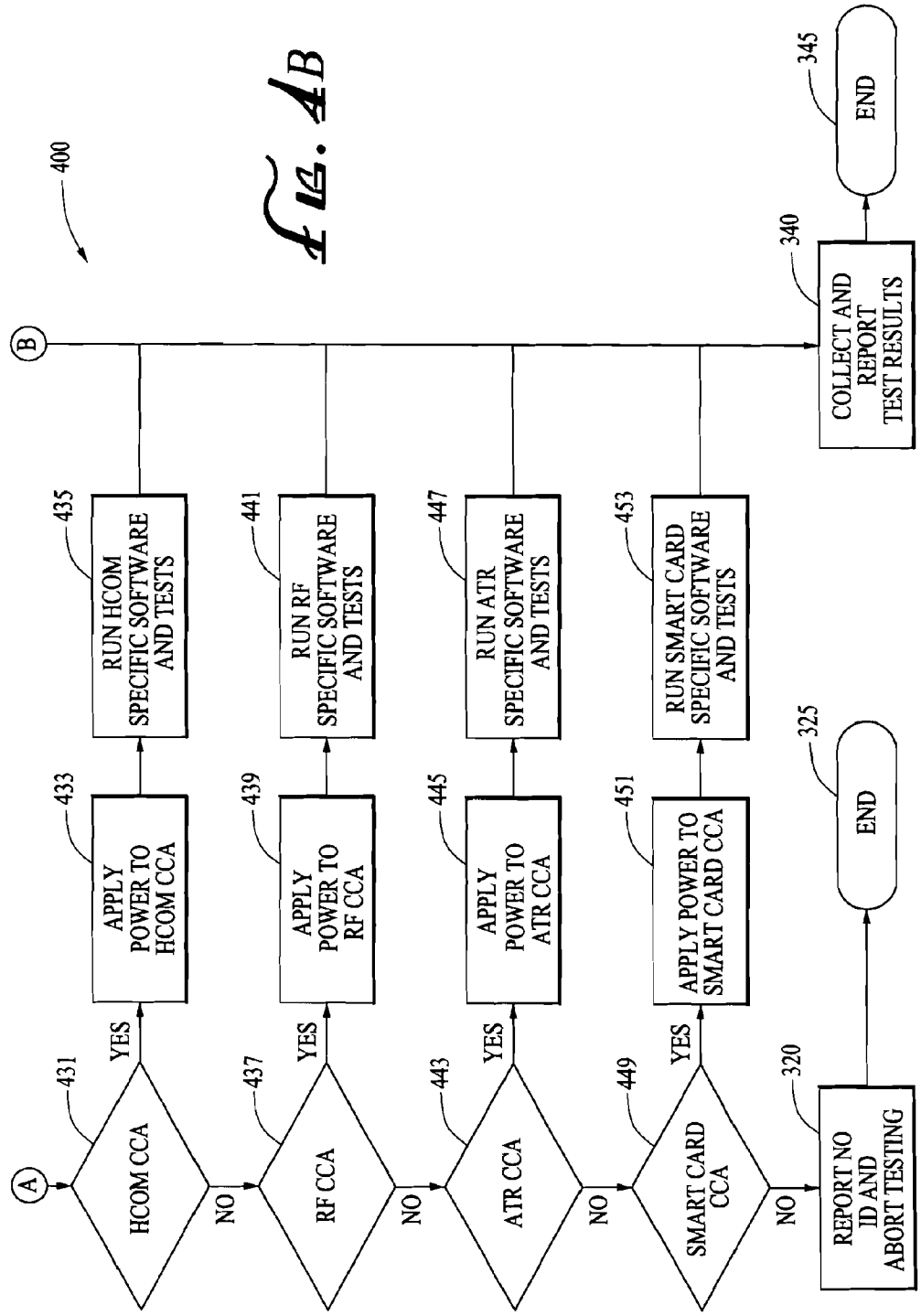
FIG. 4 is a detailed flowchart describing the steps performed by the hardware and software included as part of the BTS.

Referring to FIGS. 4a and 4b (400), shown is a lower level flowchart for the preferred embodiment describing the specific steps to perform fault isolation or production testing of a CCA (FIG. 2, 270, 272, 274, 276, or 280) that begin (step 305) by first mapping the value of the identification resistor to the type of CCA (step 310). The resistance value residing on the CCA (step 407) is read (step 405) by one of the two NI 6259 modules (FIG. 2, item 215) and mapped (step 310) to a particular type of CCA (FIG. 2, 270, 272, 274, 276, 278, or 280). An emulator check (step 411) is then made to determine if either the software emulator (FIG. 2, 250) or an actual CPU CCA (FIG. 2, 270) is to be used. If the software emulator (FIG. 2, 250) is to be used then the CPU CCA check (step 413) is skipped and a check is made (step 419) to determine if the Critical Signal/Power Control (CS/PC) CCA tests 423 are to be executed. If the software emulator (FIG. 2, 250) is not selected for use then a CPU CCA check (step 413) is performed to determine if the CPU CCA tests 417 are to be executed. If the CPU CCA tests 417 are to be executed then power is applied to the CPU CCA (FIG. 2, 270) in step 415.

In the preferred embodiment the CPU CCA tests 417 exercise the features of the CPU CCA (FIG. 2, 270) that function as an 80286 processor interface controller board. The CPU CCA (FIG. 2, 270) contains Static Random Access Memory (SRAM) and Electrically Erasable Programmable Read-Only Memory (EEPROM). The EEPROM is used to store the system bootstrap and application code. The EEPROMs are configured as 128K×8 devices. The EEPROMs can be programmed in 1 to 128 byte pages having a page-write cycle time of ten milliseconds (ms). The specific CPU CCA tests (step 417) include steps to program and read the SRAM and EEPROM memories, the processor when commanded to halt allows the NI 6259 modules (FIG. 2, 215) to directly access the SRAM and EEPROM memory devices. Then, the SRAMs and EEPROMs are then reprogrammed in 128 byte pages. The EEPROMs require a 10 ms cycle time between page writes. Each SRAM and EEPROM byte memory location is written to and read from with a value of 00 Hex (H), FF H, AA H, and 55H in order to verify that each bit in each memory location can be programmed independently of the adjacent memory bits. Also, each memory byte location is programmed and read with a pseudo random byte to ensure that each memory location is accessible and unique. All SRAM and EEPROM memory locations are handled in the same way. After the EEPROMs have been validated as functioning correctly, the CPU CCA (FIG. 2, 270) is loaded with the most current bootstrap and application code. Also, the CPU CCA (FIG. 2, 270) includes a series of tests to exercise the built in RS232 Serial Interface.

A specific set of RS232 Serial Tests (step 417) are conducted through a standard RS232 port included as part of the terminal computer (FIG. 1, 105). A null modem cable, with 9 pin Dsub connector 194, provides the interface between the terminal computer (FIG. 1, 105) and the BTS fixture (FIG. 1, 110). The BTS fixture (FIG. 1, 110) internally routes the RS232 signals to the CPU CCA (FIG. 2, 270) serial ports through the appropriate connectors. The RS232 Serial Tests (step 417) are conducted with the processor halted so that the NI 6259 modules (FIG. 2, 215) can directly access the input and output ports of the RS232 serial interfaces. The RS232 data transfer tests (step 417) are conducted in each direction with 256 possible bit patterns. This is a complete test (step 417) of all possible RS232 transfers. Also, each RS232 handshaking signal is individually tested (step 417) in each state on the receiver and transmitter to validate the complete proper operation of the RS232 Serial Ports.

Generally, as each of the specific CPU CCA tests 417 are executed the results of each test are recorded by the terminal (FIG. 1, 105) and made available to the user. The user can intervene at any point in the execution of the specific CPU CCA tests 417 and halt the test execution to perform real-time analysis of a particular test result. An intervention to halt the execution of the processor and access test points on the CPU CCA (FIG. 2, 270) by the user is performed through operation of the terminal (FIG. 1, 105).

At the completion of the specific CPU CCA tests (step 417) the test results are collected and reported (step 340). This ends the cycle (step 345) and another CCA may be loaded for testing or a subsequent test cycle may be commanded. If the CPU CCA identification check (step 413) fails, a Critical Signal and Power Control (CS/PC) CCA check (step 419) is made. If the identification check (step 419) is negative then program flow continues with step 425.

If the identification check (step 419) is positive for the presence of a CS/PC CCA (FIG. 2, 272) then power is applied to the CS/PC CCA (FIG. 2, 272) in step 421. The CS/PC CCA (FIG. 2, 272) performs a system monitoring function for the GM/LTS x86 communications bus and interface (FIG. 2, 260). The specific CS/PC CCA tests (step 423) include, but are not limited to, a Critical Signal and Relay Test, an input power test, a power relay test, a three phase power test, a power up timer reset test, a power supply test, a critical failure test, a temperature test, and a cable set status test.

The Critical Signal and Relay Tests (step 423) include monitoring selected signals and relays during a missile test. If the monitored signals should enter a failing condition during the missile test, the CS/PC CCA (FIG. 2, 272) circuitry immediately removes power from the missile under test.

Other specific CS/PC CCA tests (step 423) are the input power tests, the power relay tests, three phase tests and the power supply tests. Acceptable input power is in the range of 115 Volts (V) three-phase 400 Hertz (Hz). The BTS fixture (FIG. 2, 110) identifies alternating current (AC) that is outside of the acceptable voltage level or frequency. The input power test is accomplished using the circuit breaker status lines for validating on-board self-test switches. The testing of the three-phase input lines requires utilizing the buffered analog output of the NI 6259 modules (FIG. 2, 215). The buffered output allows a sine wave look up table to be clocked at a rate that produces a 400 Hz signal with the proper amplitude. This method produces highly spectral pure test signals. The sine wave harmonics are below minus 80 decibels (dB). An analog output signal originating in the NI 6259 module (FIG. 2, 215) is multiplexed through a semiconductor switch with low on resistance to enable sequential testing each of the three phase input ports. Each phase of the three-phase input power is measured to ensure that the Root Mean Square (RMS) amplitude is 115 V+/−10 V. The power relay test monitors the output power of each phase of the three-phase power and is compared to the requirement that it is less than 30 V RMS. The over and under voltage thresholds that are provided by the CS/PC CCA (FIG. 2, 272) circuitry that are used to drive the Avionics Launcher Interface Computer test reprogramming (ATR) CCA (FIG. 2, 280), when connected, are verified to operate correctly by applying over and under phase voltages and then measuring the system responses. A power up timer test verifies that the CS/PC CCA (FIG. 2, 272) circuitry produces a pulse that is 500 ms +/−10 ms in duration. The Power Supply status input test (step 423) verifies that the power supplies operate with a degraded input power state and also operate with fully functioning input power.

In addition to the other specific CS/PC CCA tests (step 423) described above, a plurality of digitally discrete lines are stimulated to test built-in open collector switches that are used to convey critical faults, over temperature conditions and the status of the connector cables. The BTS (FIG. 1, 100) uses these built-in open collector switches to replicate a set of self-tests performed at power up.

Additionally, the BTS (FIG. 1, 100) sends analog output signals originating from the NI 6259 modules (FIG. 2, 215) through a multi-way semiconductor switch to each external discrete input of the CS/PC CCA (FIG. 2, 272). This allows each of the discrete lines and the response to the Relay Test to be directly measured in order to determine the actual trigger voltage that stimulates the discrete switches. Each discrete switch and line is verified in both of the switch states.

If the CS/PC CCA identification check (step 419) fails, an identification check for an Analog input and output (I/O) CCA (step 425) is made. If the identification check (step 425) is positive for the presence of an Analog I/O CCA (FIG. 2, 274) then power is applied to the Analog I/O CCA (FIG. 2, 274) in step 427. If the identification check (step 425) is negative program flow continues with step 431. In the preferred embodiment the Analog I/O CCA (FIG. 2, 274) provides an analog interface having thirty external analog inputs with an input range of +/−40 V and four analog outputs with a range of +/30 V. The Analog I/O CCA (FIG. 2, 274) provides a switched loop-back capability between the analog outputs and analog inputs used for an internal self-test.

Generally, the BTS (FIG. 1, 100) executes a number of Analog I/O CCA (FIG. 2, 274) self-tests exactly as executed by the fielded GM/LTS. The of self-test validates that each of the analog channels incorporated within the Analog I/O CCA (FIG. 2, 274) will produce a linear controlled output for a given input measurement for each channel under test.

Specifically, the Analog I/O CCA tests (step 429) also include other tests, such as a reset test, a ground offset test, an onboard clock test, a self calibration test, and an external trigger test. Also, the self-test validates that there is sufficient isolation between the channel under test and other channels. This self-test methodology is sufficient to determine the existence of failed components on the Analog I/O CCA (FIG. 2, 274). However, this self-test is insufficient to determine the source of the failure. To determine the source of the failure at the component level, the self-test execution must be stopped to allow the user to access several key probable test points. Then the loop-back self-test capability must be enabled to determine which transmitter or receiver channel has failed. Each of the external thirty analog input channels is tested with the loop-back switch in an open state and in a closed state. Each channel is tested with four different linear test voltages. Then each channel is measured for isolation relative to the other channels. The BTS (FIG. 1, 100) also provides external multiplexed semiconductor switches to enable direct testing of the analog inputs and outputs on the Analog I/O CCA (FIG. 2, 274) without utilizing the analog input and output loop-back self-test.

The reset test (step 429) commands a reset of the Analog I/O CCA (FIG. 2, 274) and the response to this reset command is monitored to ensure that a reset was in fact performed. The reset test performance is evaluated by verifying that all of the Field Programmable Gate Array (FPGA) registers are in a reset state. The next test performed (step 429) is the System Grounds test that monitors analog I/O channels numbered thirty-eight and thirty-nine. The test (step 429) verifies that the analog I/O channels numbered thirty-eight and thirty-nine have offset voltages of less 0.1 V.

The Analog I/O CCA (FIG. 2, 274) also includes an onboard oscillator that drives the onboard system clock. The operation of the onboard oscillator is compared to a system oscillator utilizing special purpose hardware contained within the analog I/O FPGA dedicated to perform the onboard clock test (step 429). The onboard oscillator frequency is measured to determine whether the oscillator frequency is within the allowed limits of the test.

The two remaining tests are the self calibration test and the external trigger test. The self calibration test cycle is initiated and then verified to complete within 400 ms. The external trigger test is performed by stimulating and then collecting analog measurements when an external trigger is applied.

At the completion of the specific Analog I/O CCA tests (step 429) the test results are collected and reported (step 340). This ends the cycle (step 345) and another CCA may be loaded for testing or a subsequent test cycle may be commanded. If the identification checks (steps 425, 431, 443) fail to identify any CCA or the presence of an RF CCA (step 437) or the presence of a Smart Card (step 449) a negative result is returned in step 449 and then a report of no card identification (step 320) is had and the test cycle ends (step 325).

If the identification check (step 431) is positive for the presence of an HCOM CCA (FIG. 2, 276) then power is applied to the HCOM CCA (FIG. 2, 276) in step 433. If the identification check (step 431) is negative program flow continues with step 437.

In the preferred embodiment the HCOM CCA (FIG. 2, 276) provides a proprietary digital and analog communication interface between the HARM missile and the fielded GM/LTS and provides both hardware transmitters and receivers for all communication buses. The digital communication interface is a digital bus that is compatible with a Hand-Off Word (HOW) interface and the Seeker and Control Section (SKR/CS) buses. Both of the digital and analog interfaces use proprietary signal levels, data encodings, and timings. In addition the BTS (FIG. 1, 100) has the capability of measuring Lower Threshold/Pulse Width, Upper Threshold/Field Of View, and Azimuth Direction Finding Left/Right and Elevation Direction Finding Up/Down/Intensity.

The specific HCOM tests (step 435) run exactly as those found in fielded GM/LTS HCOM self-tests producing the exact same fail codes. In addition the BTS (FIG. 1, 100) has the ability to capture the communication analog signals during test (step 435) then display the results on a software based virtual oscilloscope that is integral to the terminal (FIG. 2, 105). The software based virtual oscilloscope is used to aid in debugging the communications interfaces.

Another specific HCOM test (step 435) tests the HOW interface by verifying twelve HOW words. Prior to each HOW transmission the digital interface is reset and then verified to be in the reset state. Then the transmission registers are individually initialized and a HOW transmission is triggered. After the HOW transmission, the time to complete the twelve HOW word transfer is verified to have occurred in less than 3 ms. Then, each of the received status registers is verified to have the correct reception value corresponding to the twelve transmitted HOW words.

The next specific test performed (step 435) is the directed towards the SKR/CS bus. The SKR/CS bus operation is verified by initiating sixteen seeker and sixteen control bus data transmissions. Prior to the data transmissions, the SKR/CS bus control registers are configured and verified to be operating correctly. The data transmissions are executed with a plurality of enabled loop-back switches. After data transmission, the reception values are validated by comparing the data transmitted to the data received.

Yet another specific HCOM test (step 435) is performed by evaluating the lower threshold and upper threshold signals as measured by an onboard timer. The onboard timer is first initialized and then verified to be cleared. Then the onboard timer is initiated with a frequency of 83.33 kHz. The onboard timer is allowed to count pulses over a period of 32 ms. An onboard timer pulse counter is then verified to have the proper count, +/−100 pulses.

At the completion of the specific HCOM CCA tests (step 435) the test results are collected and reported (step 340). This ends the cycle (step 345) and another CCA may be loaded for testing or a subsequent test cycle may be commanded. If the identification checks (steps 443) fail to identify any CCA or the presence of an RF CCA (step 437) or the presence of a Smart Card (step 449) a negative result is returned in step 449 and then a report of no card identification (step 320) is had and the test cycle ends (step 325).

If the identification check (step 437) is positive for the presence of an RF CCA (FIG. 2, 278) then power is applied to the RF CCA (FIG. 2, 278) in step 439. If the identification check (step 437) is negative program flow continues with step 443.

Upon the application of power RF specific tests (step 441) are run as described as follows. The RF CCA (FIG. 2, 278) includes a digital controller for turning on and off, and for setting the mode for missile testing using an external RF source. The external RF source is used for testing a set of HARM shutters and a plurality of Single Antenna Aperture (SAA) switches. The RF CCA (FIG. 2, 278) provides an interface with three transistor-transistor-logic (TTL) inputs and one TTL output. The TTL inputs are used to turn on one of two test targets, and to select either continuous or pulse mode operation. The TTL output is a monitored status output. The BTS (FIG. 1, 100) executes the exact same self-test performed in the fielded GM/LTS and produces the same set of fail codes. The TTL interfaces are tested (step 441) using each possible value within the range of the digital inputs and then measuring the digital output for correctness. An additional specific test (step 441) is capable of emulating the Source and Antenna BIT detector inputs for a more complete testing of the digital inputs.

At the completion of the specific RF CCA tests (step 441) the test results are collected and reported (step 340). This ends the cycle (step 345) and another CCA may be loaded for testing or a subsequent test cycle may be commanded. If the identification checks (steps 443) fail to identify any CCA or the presence of a Smart Card (step 449) a negative result is returned in step 449 and then a report of no card identification (step 320) is had and the test cycle ends (step 325).

If the identification check (step 443) is positive for the presence of an Aircraft Launcher and Interface Computer (ALIC) Test Reprogramming (ATR) CCA (FIG. 2, 280) then power is applied to the ATR CCA (FIG. 2, 280) in step 447. If the identification check (step 443) is negative program flow continues with step 449.

If the identification check (step 443) is positive for the presence of an ATR CCA (FIG. 2, 280) then power is applied to the ATR CCA (FIG. 2, 280) in step 447. Upon the application of power specific ATR CCA tests (step 447) are run as described below.

The ATR CCA (FIG. 2, 280) acts as an interface to enable communication between the GM/LTS x86 communications bus and interface 260 and the ALIC. The ATR CCA (FIG. 2, 280) includes two MIL-STD-1553 communication boards, seven internal analog discrete channels, and seven internally amplified source signals. The ATR CCA (FIG. 2, 280) provides two transformer-isolated MIL-STD-1553 channels. The transformer-isolated MIL-STD-1553 channels require an external MIL-STD-1553 interface (FIG. 2, 242) to accommodate testing (step 447). A four Channel MIL-STD-1553 board (FIG. 2, 240) is provided in the terminal computer (FIG. 2, 105) for communicating with the MIL-STD-1553 interface on the ATR CCA (FIG. 2, 280).

In the preferred embodiment the specific ATR CCA tests (step 447) include the MIL-STD-1553 interface test, a memory test, a video test, a HOW test, a multiplexor test, a video sync test, a crossing zero test, a control relay test, and a test of the analog discrete lines. The terminal computer (FIG. 2, 105) executes a complete data pattern loop-back test (step 447) of the MIL-STD-1553 interface integral to the ATR CCA (FIG. 2, 280), and executes the self-test (step 447) providing the same fault codes list found in the fielded GM/LTS.

The ATR CCA (FIG. 2, 280) utilizes random access memory (RAM) contained within an onboard FPGA. The RAM is used as a 128 byte scratch pad memory for storing sampled analog inputs. The memory is tested (step 447) by writing all locations with data values 55H and AA H, and then verifying the values stored in RAM.

The ATR Video, the HOW Hi and Lo, and the Multiplxor A and B outputs are individually tested (step 447) in three separate modes with a varying test voltage. The analog signals are sampled and stored into 128 byte internal RAM and then validated for correctness. The ATR Video is commanded (step 447) to produce a periodic sync pulse. The period and latency of the video sync pulses are then validated for correctness.

The remaining specific tests performed in step 447 are: an ATR FPGA clock test where the ATR FPGA clock is measured and verified to have a pulse width of 5120 nanoseconds (ns) and 50% duty cycle. After an ATR reset is commanded (step 477), the ATR FPGA relay control registers are verified such that all relays can be turned off. Each of the analog discrete lines is tested at two internal test voltage settings and then validated to be within +/−0.3 V of the internal test voltage.

At the completion of the specific ATR CCA tests (step 447) the test results are collected and reported (step 340). This ends the cycle (step 345) and another CCA may be loaded for testing or a subsequent test cycle may be commanded. If the CCA identification check (step 443) fails to identify any CCA and the presence of a Smart Card (FIG. 2, item 265) is negative in step 449 then a report of no card identification (step 320) is made and the test cycle ends (step 325).

If the identification check (step 443) is positive for the presence of a Smart Card CCA (FIG. 2, 265) then power is applied to the Smart Card CCA (FIG. 2, 265) in step 451. Upon the application of power Smart Card CCA specific tests (step 453) are run as described below.

The Smart Card CCA (FIG. 2, 265) is also an 80286 processor interface controller board. The Smart Card CCA (FIG. 2, 265) contains SRAM and EEPROM types of memory. The EEPROM is used to store the System Bootstrap and Application Code. Also, the Smart Card CCA (FIG. 2, 265) includes a built in RS232 Serial Interface. The Smart Card CCA (FIG. 2, 265) is utilized for HARM reprogramming. Therefore, it has additional EEPROM used to store missile executable code and has additional digital input and output to implement the reprogramming port.

The EEPROMs used on the Smart Card CCA (FIG. 2, 265) are also configured as 128K×8 devices. A series of specific tests (step 453) are performed beginning with the EEPROMs that are programmed in 1 to 128 byte pages. The page-write cycle time is 10 ms. To program the memories directly, the processor is halted so that the NI 6259 modules 215 can directly access the memory devices. Then, the SRAMs and EEPROMs are reprogrammed in 128 byte pages. Only the EEPROMs require a 10 ms cycle time between page writes. Each byte memory location is programmed and read with a value of 00H, FF H, AA H, and 55H to verify that each bit in each memory location can be programmed independently of the adjacent memory bits. Also, each memory byte location is programmed and read with a pseudo random byte to ensure that each memory location is unique. All SRAM and EEPROM memories are handled in the same way.

When the EEPROMs have been validated to be functioning correctly (step 453), the user is provided with the option to load the Smart Card CCA (FIG. 2, 265) with the Bootstrap and Application code. Each digital input and output signal of the Smart Card reprogramming port is tested by writing a set of "walking 1 s" to each of the programming registers and then verifying the stored value is as expected. This test (step 453) validates the operation and programmability of each of the Smart Card CCA (FIG. 2, 265) programming registers. In the preferred embodiment the Smart Card CCA (FIG. 2, 265) provides a plurality of digital input and output lines for connecting up to two HARM missiles simultaneously for software reprogramming. Each HARM missile programming port requires up to fifty-nine digital input and output lines.

The external Smart Card input and output port is tested (step 453) using an external loop back connector that plugs directly into the reprogramming port connector. In this method, a connection is made between all pairs of digital input and output lines. Each line is driven by one of the pair members and is measured by the other member. Then the direction is reversed and the test repeated. This method is sufficient to detect digital port failures. However, when failures are discovered, the loop back connections must be broken to be able to determine whether the failure occurs on the transmitter side or the receiver side. The specific test software (step 453) allows the software execution to be halted in the presence of a failure. The halting feature (step 453) allows the user to remove the loop back connector when the failure occurs so that the pins can be directly probed to determine failing circuit nodes.

A specific set of RS232 Serial Tests (step 453) are conducted through a standard RS232 port included as part of the terminal computer 105. A null modem cable, with 9 pin Dsub connector 194, provides the interface between the terminal computer 105 and the BTS fixture 110. The BTS fixture 110 internally routes the RS232 signals to the Smart Card CCA 265 serial ports through the appropriate connectors. The RS232 Serial Tests (step 453) are conducted with the processor halted so that the NI 6259 modules 215 can directly access the input and output ports of the RS232 serial interfaces. The RS232 data transfer tests (step 453) are conducted in each direction with 256 possible bit patterns. This is a complete test (step 453) of all possible RS232 transfers. Also, each RS232 handshaking signal is individually tested (step 453) in each state on the receiver and transmitter to validate the complete proper operation of the RS232 Serial Ports.

At the completion of the specific Smart Card CCA tests (step 453) the test results are collected and reported (step 340). This ends the cycle (step 345) and another CCA may be loaded for testing or a subsequent test cycle may be commanded. If the CCA identification check (step 449) fails to identify the presence of a Smart Card (FIG. 2, item 265) returning a negative to the check in step 449 then a report of no card identification (step 320) is made and the test cycle ends (step 325).

Although the present invention has been described in considerable detail with references to certain preferred versions thereof, other versions are possible. For example, interface connections and different interface boards may be added, software driver programming languages may differ, and other external configurations of the hardware chassis may change. Therefore, the spirit and scope of the appended claims should not be limited to the description of the preferred versions contained herein.

What is claimed is:

1. A high speed anti-radiation missile guided missile launcher test set circuit card assembly testing system comprising:
   a terminal computer for providing a platform for hosting a computer processor and a test software module;
   a user interface connected to said terminal computer for providing a set of user commands to control an operational test of said terminal computer;
   a plurality of bi-directional interfaces for connecting said terminal computer to a board test set;
   a data acquisition software module for controlling communications of a portion of said plurality of bi-directional interfaces wherein said data acquisition software module is in communication with said computer processor and said board test set;
   a data acquisition hardware module responsive to said data acquisition software module, said data acquisition hardware suite connected to said plurality of bi-directional interfaces and to said board test set;
   an emulator software module for replicating a behavior of a fielded central processing unit, wherein said behavior of the fielded central processing unit is controlled by said terminal computer wherein said emulator software module is in communication with said data acquisition software module, with said data acquisition hardware module and with said board test set when said emulator software module is active; and
   a card cage mounted onto said board test set for accepting a high speed anti-radiation missile guided missile launcher test set circuit card assembly, wherein said high speed anti-radiation missile guided missile launcher test set circuit card assembly is subjected to said operational test controlled by said user interface and said operational test resulting in a determination of a functional status of said high speed anti-radiation missile guided missile launcher test set circuit card assembly, wherein said functional status is reported to a user, wherein said high speed anti-radiation missile guided missile launcher set circuit card assembly has a total number of test access points built thereon, wherein said total number of test access points includes at least one external test access points not routed to a connector; and wherein said card cage is configured and mounted onto said board test set to provide direct probing accessibility to said at least one external test access points; wherein said high speed anti-radiation missile guided missile launcher test set circuit card assembly is external to said cage when said high speed anti-radiation missile guided missile launcher test set circuit card assembly is mounted to said card cage.

2. The circuit card assembly testing system claimed in claim 1, wherein said plurality of bi-directional interfaces includes an analog interface, a digital interface and an asynchronous communications interface.

3. The circuit card assembly testing system claimed in claim 1, wherein said data acquisition software module is programmable in a computer language selected from the group consisting of C and C++ computer languages.

4. The circuit card assembly testing system claimed in claim 1, wherein said test software module includes a computer program for performing an identification of a type of said circuit card assembly, for applying an input power waveform to said circuit card assembly based on said identification of the type of said circuit card assembly, for executing a plurality of tests on said circuit card assembly based on said identification, and reporting a result of said plurality of tests to said user.

5. The circuit card assembly testing system claimed in claim 4, wherein said computer program includes a command to halt an execution of said computer program, said circuit card assembly testing system being adapted and configured to provide direct probing accessibility to said total number of test access points when said computer program is halted.

6. The circuit card assembly testing system claimed in claim 1, wherein said emulator software module is operatively compatible with an x86 communications bus interface.

7. The circuit card assembly testing system claimed in claim 1, wherein said card cage includes two keyed guide panels.

8. A board test set comprising:
  means for hosting a computer processing unit;
  means for providing a set of user commands to control an operation of said computer processing unit;
  means for providing and connecting a plurality of bi-directional interfaces between said computer processing unit and a board test set;
  means for providing and controlling a data acquisition module that is in communication with a portion of said plurality of bi-directional interfaces wherein said data acquisition software module is also in communication with said computer processing unit and said board test set;
  means for accepting a designated high speed anti-radiation missile guided missile launcher test set circuit card assembly into said board test set;
  means for replicating a fielded central processing unit, wherein a replication of said fielded central processing unit is controlled by said computer processing unit and is in simultaneous communication with said data acquisition module and said board test set;
  means for performing an operational test on said designated high speed anti-radiation missile guided missile launcher test set circuit card assembly, said operational test producing a result that corresponds to a functional status of said designated high speed anti-radiation missile guided missile launcher test set circuit card assembly;
  means for halting said means for performing said operational test wherein said means for halting allows a user to view an operational state of circuitry embedded on said designated high speed anti-radiation missile guided missile launcher test set circuit card assembly by manually directed positioning of an external test probe to externally accessible test points on said designated high speed anti-radiation missile guided missile launcher test set circuit card assembly;
  means for reprogramming said designated high speed anti-radiation missile guided missile launcher test set circuit card assembly with a system bootstrap and an application code; and
  means for collecting and reporting a result of said operational test to a user.

9. The board test set claimed in claim 8, wherein said plurality of bi-directional interfaces accommodates a plurality of analog signals, a plurality of digital signals and a plurality of asynchronous messages.

10. The board test set claimed in claim 8, wherein said means for controlling said data acquisition module includes a computer program programmed in an object oriented programming language.

11. The board test set claimed claim 8, wherein said means for performing includes:
  means performing an identification of a type of said high speed anti-radiation missile guided missile launcher test set circuit card assembly,
  means for applying an input power to said high speed anti-radiation missile guided missile launcher test set circuit card assembly based on said identification,
  means for executing a plurality of tests on said high speed anti-radiation missile guided missile launcher test set circuit card assembly based on said identification, and
  means for reporting a failure of said means performing said identification to said user.

12. The board test set claimed in claim 8, wherein said means for replicating said fielded central processing unit further includes a computer program compatible with an x86 instruction set.

13. The board test set claimed in claim 8, wherein said means for accepting said high speed anti-radiation missile guided missile launcher test set circuit card assembly includes a means for accepting a locking mechanism, wherein said locking mechanism is affixed to said high speed anti-radiation missile guided missile launcher test set circuit card assembly.

14. A method of testing a high speed anti radiation missile guided missile launcher test set circuit card assembly, said method comprising:
  hosting a computer processing unit;
  providing a set of user commands to control an operation of said computer processing unit;
  providing a plurality of bi-directional interfaces between said computer processing unit and a board test set, wherein said plurality of bi-directional interfaces accommodates a plurality of analog signals, a plurality of digital signals and a plurality of asynchronous messages;
  connecting said plurality of bi-directional interfaces between said computer processing unit and said board test set;
  providing a data acquisition module that is in communication with a portion of said plurality of bi-directional interfaces wherein said data acquisition software module is also in communication with said computer processing unit and said board test set;
  controlling said data acquisition module that is in communication with said portion of said plurality of bi-directional interfaces wherein said data acquisition software module is also in communication with said computer processing unit and said board test set;
  accepting said high speed anti radiation missile guided missile launcher test set circuit card assembly into said board test set;
  replicating a fielded central processing unit, wherein a replication of said fielded central processing unit is controlled by said computer processing unit and is in simultaneous communication with said data acquisition module and said board test set;
  performing an operational test on said high speed anti radiation missile guided missile launcher test set circuit card assembly, said operational test producing a result that corresponds to a functional status of said high speed anti radiation missile guided missile launcher test set circuit card assembly;

testing an external test point on said high speed anti radiation missile guided missile launcher test set circuit card assembly by manually positioning an external test probe on said external test point;

reprogramming said high speed anti radiation missile guided missile launcher test set circuit card assembly with a system bootstrap and an application code; and collecting and reporting a result of said operational test to a user.

15. The method in claim 14, wherein said external test point is not routed to a connector, and said performing step comprises:

performing an identification of a type of said high speed anti radiation missile guided missile launcher test set circuit card assembly, applying an input power to said high speed anti radiation missile guided missile launcher test set circuit card assembly based on said identification, executing a plurality of tests on said high speed anti radiation missile guided missile launcher test set circuit card assembly based on said identification, and reporting a failure of said high speed anti radiation missile guided missile launcher test set circuit card assembly to said user.

* * * * *